(12) United States Patent
Waters (10) Patent No.: US 7,492,260 B2
(45) Date of Patent: Feb. 17, 2009

(54) INDUCTIVELY POWERED TRANSPONDER DEVICE

(75) Inventor: John Waters, Stoke Gifford (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 291 days.

(21) Appl. No.: 11/486,093

(22) Filed: Jul. 14, 2006

(65) Prior Publication Data

US 2007/0096910 A1    May 3, 2007

(30) Foreign Application Priority Data

Oct. 27, 2005    (GB) .................................. 0521893.8

(51) Int. Cl.
*G08B 13/14* (2006.01)
(52) U.S. Cl. .................. 340/572.1; 340/572.8; 361/737
(58) Field of Classification Search ............. 340/572.1, 340/572.7, 572.8; 361/737, 761, 801; 235/492; 438/14
See application file for complete search history.

(56) References Cited

U.S. PATENT DOCUMENTS

| 4,380,699 | A |   | 4/1983 | Monnier et al. |
| 5,419,780 | A | * | 5/1995 | Suski .................. 136/205 |
| 6,211,785 | B1 | * | 4/2001 | Tuttle et al. .............. 340/572.1 |
| 6,239,976 | B1 |   | 5/2001 | Templeton et al. |

FOREIGN PATENT DOCUMENTS

| EP | 0 463 871 | 1/1992 |
| WO | 98/45806 | 10/1998 |

* cited by examiner

*Primary Examiner*—Anh V La (57) ABSTRACT

An inductively powered transponder device has an unpackaged integrated circuit in which is integrated an antenna for receiving power and signal from radio frequency transmissions. A heatsink is thermally connected to the integrated circuit. The heatsink has means to prevent eddy currents. A first layer and a second layer of web material are attached together to encapsulate the integrated circuit and the heatsink.

16 Claims, 8 Drawing Sheets

INDUCTIVELY POWERED TRANSPONDER DEVICE

This application claims priority from Great Britain patent application 0521893.8, filed on Oct. 27, 2005. The entire content of the aforementioned application is incorporated herein by reference.

FIELD OF THE INVENTION

The invention relates to an inductively powered transponder device and to its manufacture.

BACKGROUND OF THE INVENTION

Transponder devices such as a coil-on-chip RFID device can contain all their functional elements within a single integrated circuit chip. Power to the device is provided by radio frequency transmission, which is picked up by the antenna coil and energises the chip to provide signal. Such devices can be very complex and work at very high speed, generating tens of milliwatts of heat that needs to be dissipated. This is sufficient to cause chip temperatures to rise at rates exceeding 200° C./sec to temperatures greater than 100° C. Thermal stresses from such temperature rises and such high temperatures may affect device performance—they can cause reliability problems and render the device temporarily inoperative.

Conventional integrated circuits are capable of dissipating heat in these quantities when mounted in packages (such as a conventional DIL package). This is not a preferred option for a coil-on-chip RFID device: there is no need to connect to a power source or any other electrical component, and it is desirable to use form factors (such as low profile mounting on a printed page) inconsistent with conventional chip packaging technologies. It is thus desirable to find a solution to the problem of heat dissipation which allows for versatile and effective use of such devices.

SUMMARY OF THE INVENTION

In a first aspect, the invention provides an inductively powered transponder device which comprises: an unpackaged integrated circuit in which is integrated an antenna for receiving power and signal from radio frequency transmissions; a heatsink thermally connected to the integrated circuit and having means to prevent eddy currents; and a first layer and a second layer of web material attached together to encapsulate the integrated circuit and the heatsink.

DESCRIPTION OF DRAWINGS

Specific embodiments of the invention will now be described, by way of example, with reference to the accompanying drawings, of which.

DESCRIPTION OF SPECIFIC EMBODIMENTS

Embodiments of the invention will now be described. In these embodiments, memory tags will be used as examples of inductively powered transponder devices for which aspects of the invention may be employed. The skilled person will appreciate that the present invention may equally be employed for other forms of transponder device. A memory tag is a passive memory circuit which is powered, read (and in some cases written) by a powering read or read/write device. In the embodiments described here, the memory tag is powered inductively. The commonest type of memory tag technology is RFID. This currently does not pose excessive power demands as conventional RFID tags contain little data, operate at low speeds and require little power to operate. Embodiments of the invention are described with respect to an alternative memory tag technology which operates at GHz frequencies, operates at near-contact distances, and which can transfer large amounts of data at very high data rates.

Figure 1:
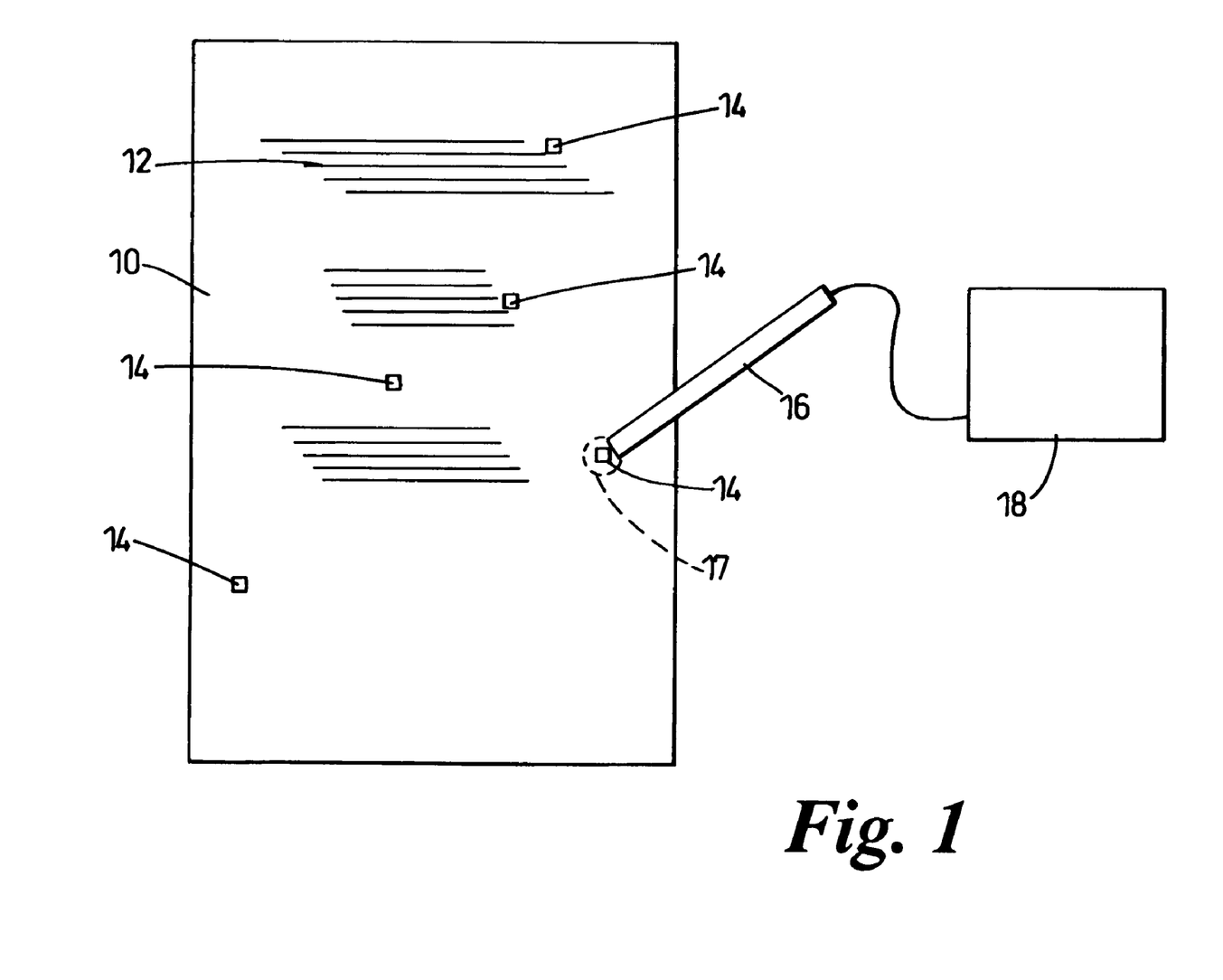
FIG. 1 shows a sheet of paper annotated with electronic data using memory tags in accordance with embodiments of the invention.

Use of such a technology provides significant power dissipation issues, particularly for desired uses such as annotation of documents. This is shown in the example of FIG. 1. FIG. 1 illustrates an item, in this case a sheet of paper 10, bearing printing 12, which has been annotated with electronic data using a plurality of memory tags 14. The memory tags 14 have been secured to or embedded in the sheet of paper 10 in locations identified by the printing 12, in order to assist in locating them for the purposes of reading data from or writing data to the memory tags 14. It is desirable for memory tags used in this context to have a very low profile, so that they do not prevent the sheet of paper 10 from being used as a normal sheet of paper. If sheets of paper 10 bearing memory tags 14 had significantly different properties from conventional sheets of paper and thus could not be used in the same versatile way, annotation of paper with memory tags would be a less versatile and hence less attractive form of annotation and would therefore have fewer practical uses.

A hand held read/write device 16 is used to communicate with the memory tags 14 in wireless manner. The read/write device 16 is also connected to a host computer, display, data rendering device or other apparatus 18 from which the data for writing to the memory tags 14 is received, and/or the data read from the memory tags 14 is passed. In other arrangements, the read/write device and the host computer may be the same device (for example, a cellular telephone with a display and an integrated reader).

Figure 2:
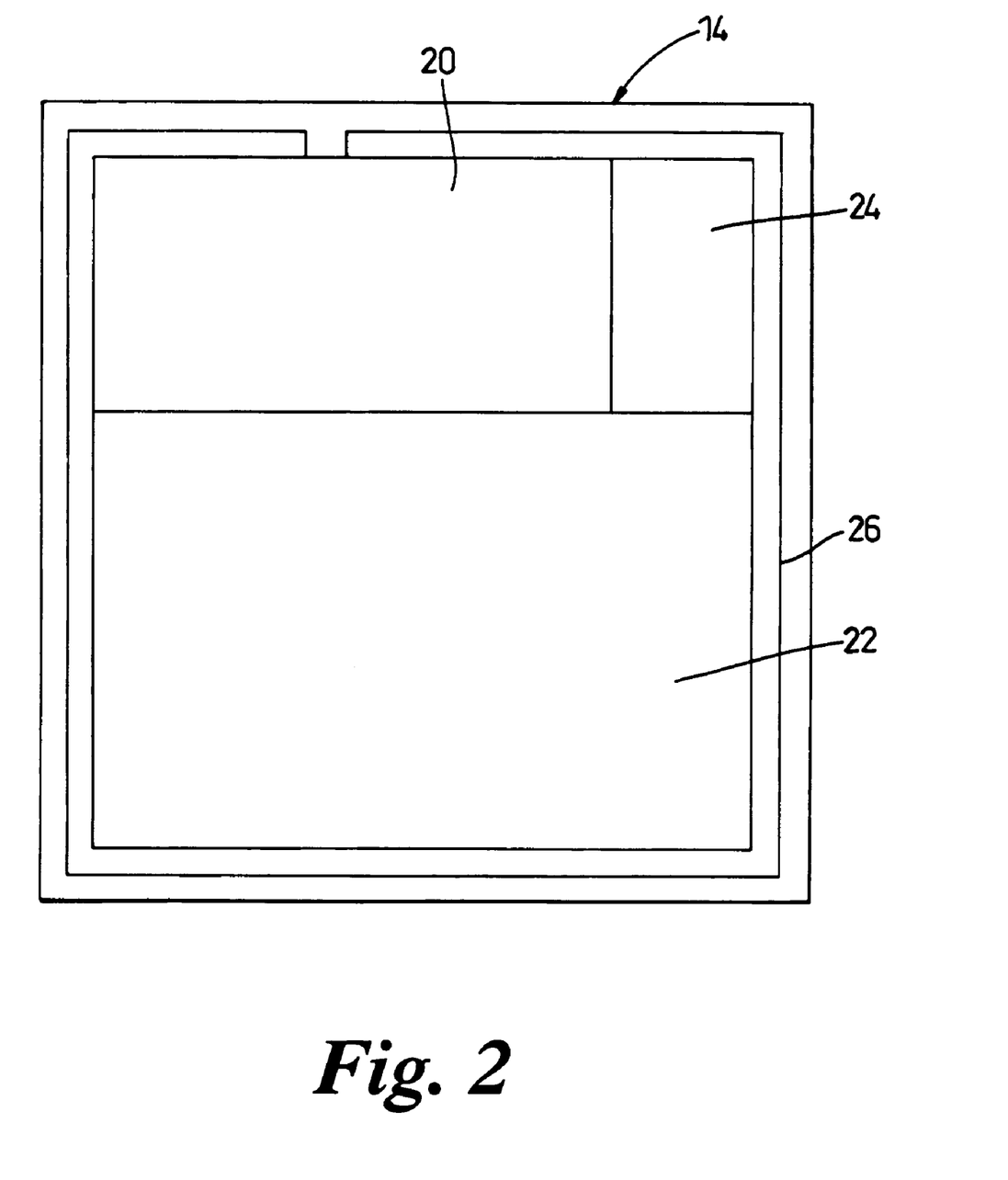
FIG. 2 shows an unpackaged memory tag chip suitable for use in embodiments of the invention.

Referring now to FIG. 2, a schematic of a memory tag 14 is shown. The memory tag 14 is an RFID memory tag provided on a chip, and comprises an RFID transponder circuit 20, a memory 22, a power supply capacitor 24 and an antenna coil 26 which may have many turns, or as in this case a single turn. The RFID transponder circuit 20 operates at 2.45 GHz and is of an area of approximately 0.5 mm$^2$. The memory 22 provides 1 Mbit of capacity of non-volatile memory and is of an area of approximately 1 mm$^2$, and uses FRAM (ferroelectric random access memory) or MRAM (magnetoresistive random access memory) or NAND Flash memory or similar memory technology requiring low power. The memory tags 14 are of a substantially square shape in plan view with an external dimension D for their sides of around 1.5 mm.

Figure 3:
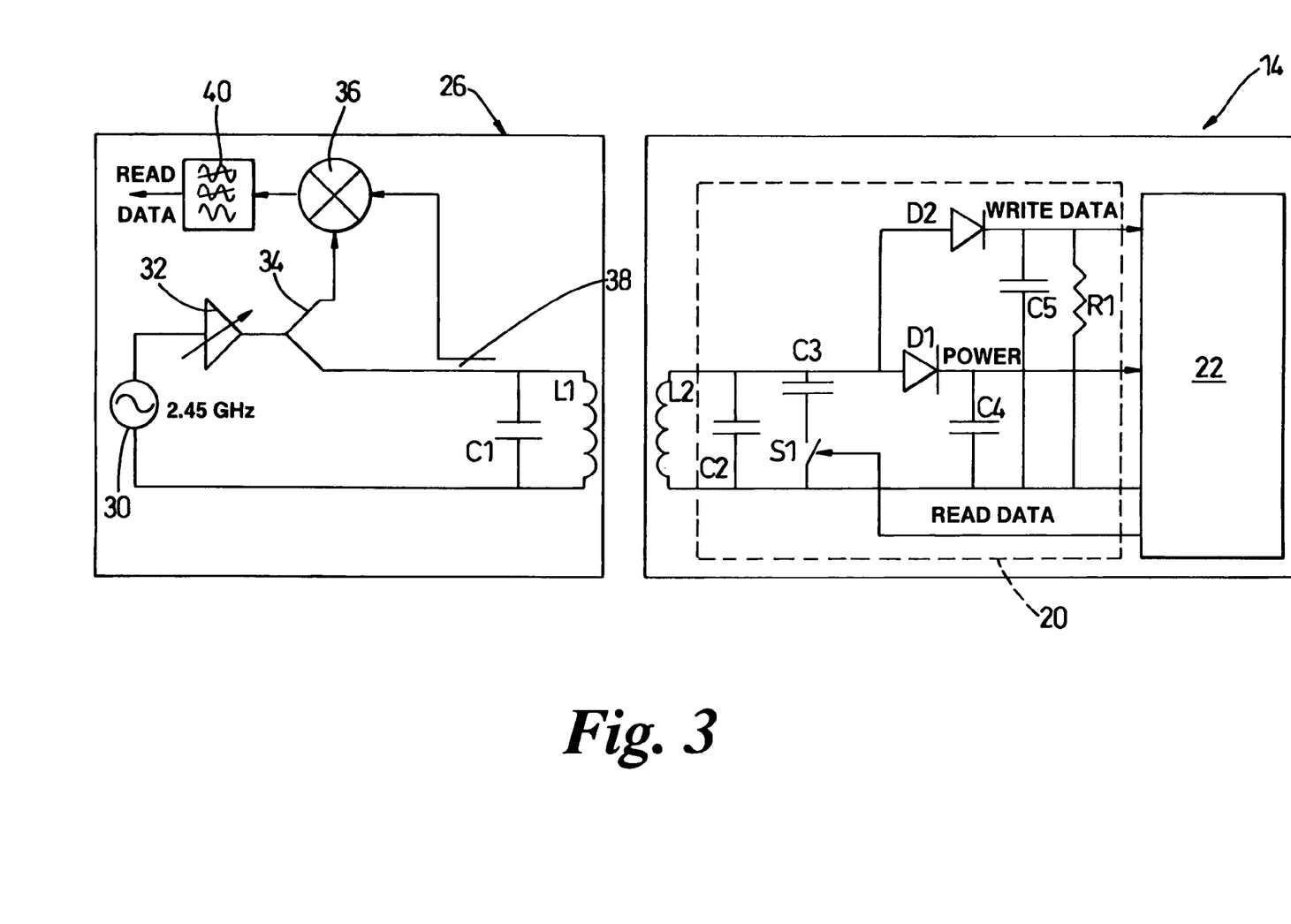
FIG. 3 illustrates the circuitry of the memory tag of FIG. 2 and of a read/write device for wireless communication with the memory tag.

Referring now to FIG. 3, the circuitry of a memory tag 14 and circuitry 28 of the read/write device 16 are illustrated schematically, using conventional component identifications (C-capacitor, L-inductance, R-resistor, D-diode and S-switch). The RFID transponder circuit 20 of the memory tag 14 comprises a capacitor C2 which, in combination with the antenna coil L2 (26), forms a resonant circuit with component values being chosen to tune the combination to approximately 2.45 GHz for inductive coupling with the read/write device 16. The portion of transponder circuit 20 responsible for power supply is diode D1 and capacitor C4 (24), with diode D1 rectifying the alternating current generated by the inductive coupling and the capacitor C4 acts as power supply storage. The portion of the transponder circuit 20 responsible for receiving transmitted data from the read/write device 16 is diode D2, capacitor C5 and resistor R1 which form a simple envelope detector; the data thus received is stored in memory 22. The portion of the transponder circuit 20 responsible for the reading of data from the memory 22 is the tuned circuit L2/C2 in combination with S1 and C3, switching C3 in and out of the circuit using S1 changes the resonance of tuned circuit L2/C2 resulting in phase modulation of the reflected power from the memory tag 14 to the read/write device 16.

The circuit 26 of the read/write device 16 comprises a signal generator 30 which generates a signal at the chosen frequency of 2.45 GHz. This signal passes via an amplitude modulator 32, where it is amplitude modulated with data to be written to the memory tag 14, and a splitter 34, to an antenna L1 and capacitor C1 which form a tuned circuit. The component values of L1 and C1 being chosen to tune it to 2.45 GHz, as for the tuned circuit in the memory tag 14, in order to maximise inductive coupling between the two circuits, and thus transmission of power and data to the memory tag 14.

The splitter 34 takes a part (as much as 50% of the power) of the amplitude modulated signal, for use as a reference signal, and passes it to a multiplier 36. The signal received from the memory tag 14, via the tuned circuit L1/C1 and divided from the outgoing signal by a coupler 38, is also passed to the multiplier 36. Thus the transmitted amplitude modulated signal and received signal are multiplied and then pass through a low pass filter 40 to provide a signal comprising the phase modulation from the memory tag 14 and thus indicative of the data read from the memory tag 14. This signal is then passed to the host computer or other device 18 to which the read/write device 16 is connected, for subsequent data processing.

One amplitude modulation format which may be used to apply the data to be transmitted to the 2.45 GHz signal is Amplitude Shift Keying (ASK) which only requires the simple envelope detector D2/C5 described in the circuit 20. However, other amplitude modulation formats may also be employed. Further alternatives are Frequency Shift Keying (FSK) and Phase Shift Keying (PSK) that provide near constant envelope modulation, that is modulation without any significant amplitude modulation. These options have more complex demodulation requirements and thus demand more complex circuitry in the memory tag 14.

With the apparatus of memory tag 14 and read/write device 16 described above power transfer of around 20% can be achieved with a distance of around 1 mm between the antennae L1 and L2, of the read/write device 16 and memory tag 14 respectively. This is sufficient to transfer enough power to the memory tag 14 for it to operate.

The memory tags 14 have an external dimension D of around 1.5 mm, as described above, and therefore the read/write device 16 can communicate with them over a relatively short range, in this example of approximately 2 D (as illustrated on FIG. 1 by broken circle 17). However, the distance over which the read/write device 16 and memory tag 14 will communicate effectively will clearly vary with the exact details of their construction, and it may therefore be up to 10 D. Communication over distances greater than this would limit the ability to use a plurality of memory tags 14 on a single sheet of paper 10, or other item, due to the distances which would be necessary between the memory tags 14 to ensure that the read/write device 16 does communicate with the desired memory tag 14 out of a number present. To ensure that communication is with the correct memory tag 14 in every circumstance a communication distance of 5 D or less is preferable.

The memory tags 14 will preferably have a data rate of 10 Mbitss$^{-1}$, which is two orders of magnitude faster than is typical in prior art devices. Such a data rate would enable the read/write device 16 to be held over the memory tag for a very short period of time ("brush and go") for the data to be read or written as appropriate.

Although the memory tags 14 described above operate at 2.45 GHz it should be understood that memory tags operating at other frequencies may be used in embodiments of the invention. Factors affecting the choice of operating frequency for the memory tags are: a) government regulations concerning radio frequency transmissions; b) adequate bandwidth (consistent with government regulations); c) frequency high enough to render the physical size of components in the memory tag small enough to keep the area of silicon required low (and hence the cost to manufacture low); d) frequency low enough to provide adequate performance when using low-cost high-volume CMOS technology to manufacture the memory tag.

Figure 8:
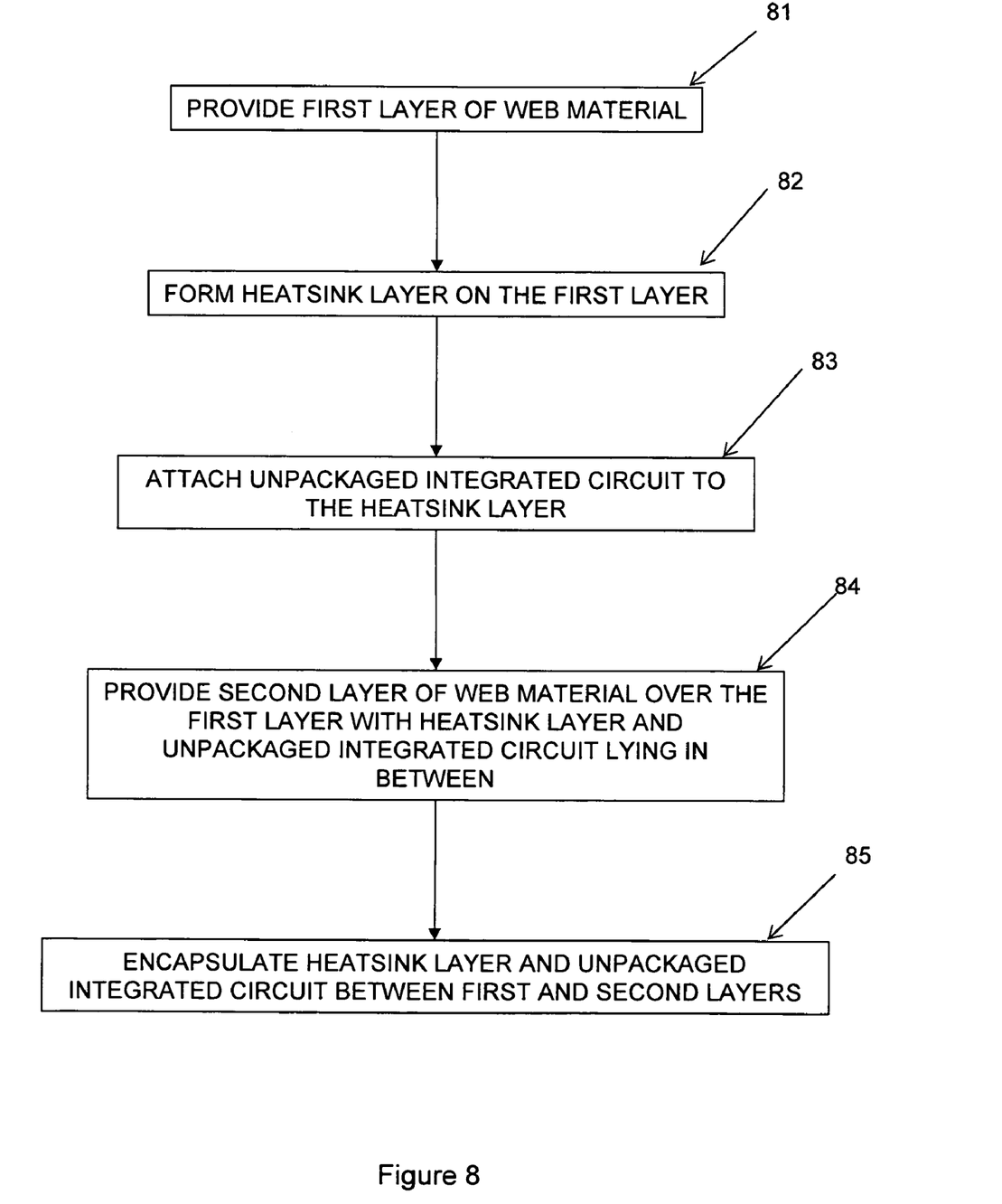
FIG. 8 illustrates schematically a method of manufacture of an inductively powered transponder device according to an embodiment of the invention.

To operate memory tags of the kind shown in FIGS. 2 and 3 at high data rates and at high duty cycles, it is desirable to find a way to dissipate 10-30 mW of heat effectively from the memory tag chip. FIGS. 4A to 4E show steps in manufacture of a packaged memory tag which achieves such heat dissipation in accordance with embodiments of the invention, and does so in an arrangement suitable for use in contexts such as that shown in FIG. 1. An overall process of manufacture is indicated schematically in FIG. 8.

Figure 4A:
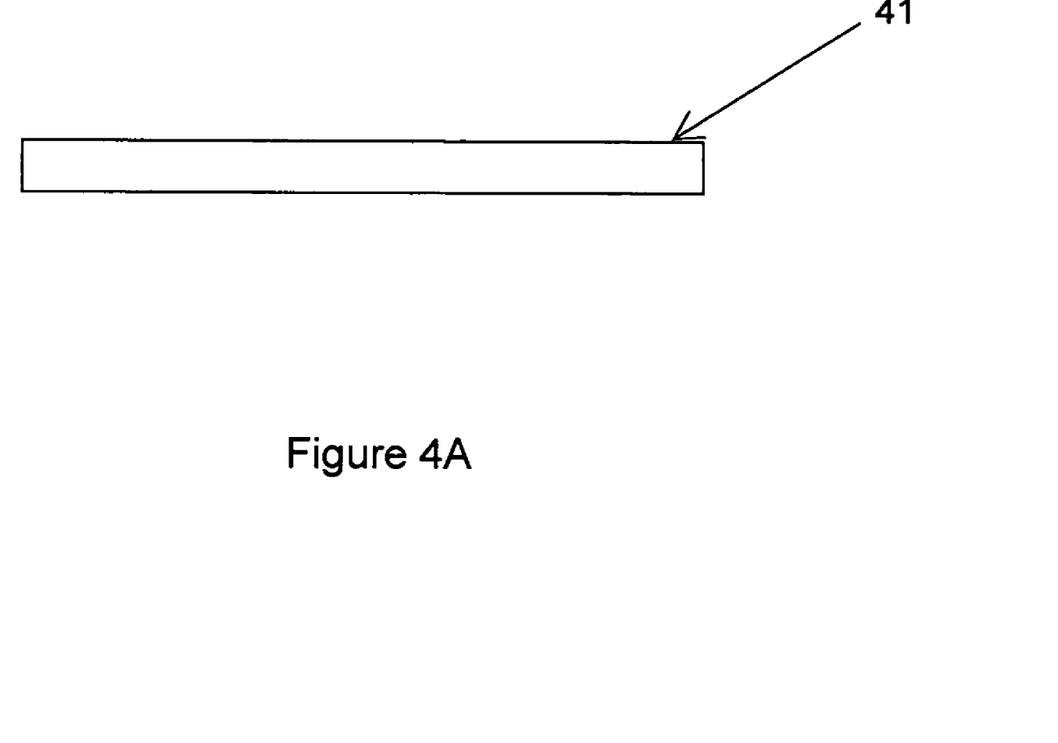
FIGS. 4A to 4E show steps in a method of manufacture of an inductively powered transponder device such as a memory tag according to an embodiment of the invention.

In the first step 81, shown in FIG. 4A, a first layer 41 of a web material—in embodiments for many use contexts this may desirably be a plastics material, but it may in other use contexts desirably be a paper—is provided. It should be noted that many devices may here be formed in parallel—only one memory tag will be shown in FIGS. 4A to 4E, but many tags may be formed together from an extended length of web material.

Figure 4B:
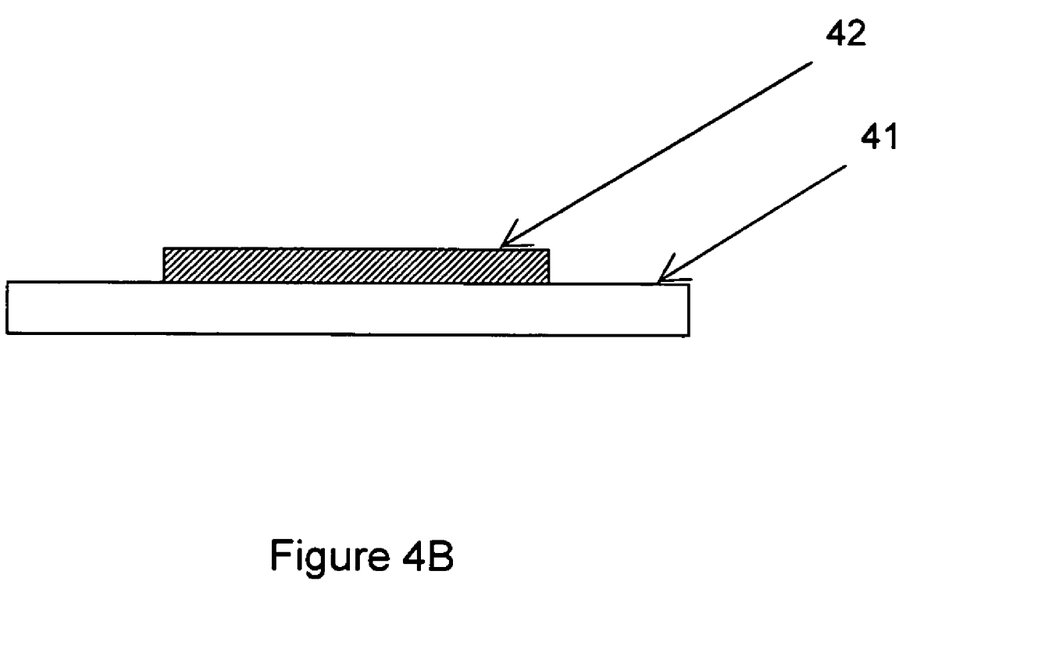

In the second step 82, shown in FIG. 4B, a heatsink layer 42 is formed over the first layer 41 of web material. This may simply be provided by bonding a freestanding heatsink to the first layer 41 of web material (for example, with an epoxy). In other contexts, it may be desirable to provide the heatsink layer 42 by providing a metallization layer over the first layer 41 of web material—the skilled person will appreciate that a wide range of conventional metallization techniques may be used for this purpose (the metallization may need to be thicker than is normal in most integrated circuit contexts, but far lower resolution is likely to be required than for integrated circuit design). Copper would be an appropriate choice for a freestanding heatsink or a metallization, as copper has appropriate thermal and electrical properties, but a wide range of other thermally conductive materials could also be employed, as the skilled person will readily appreciate.

Figure 4C:
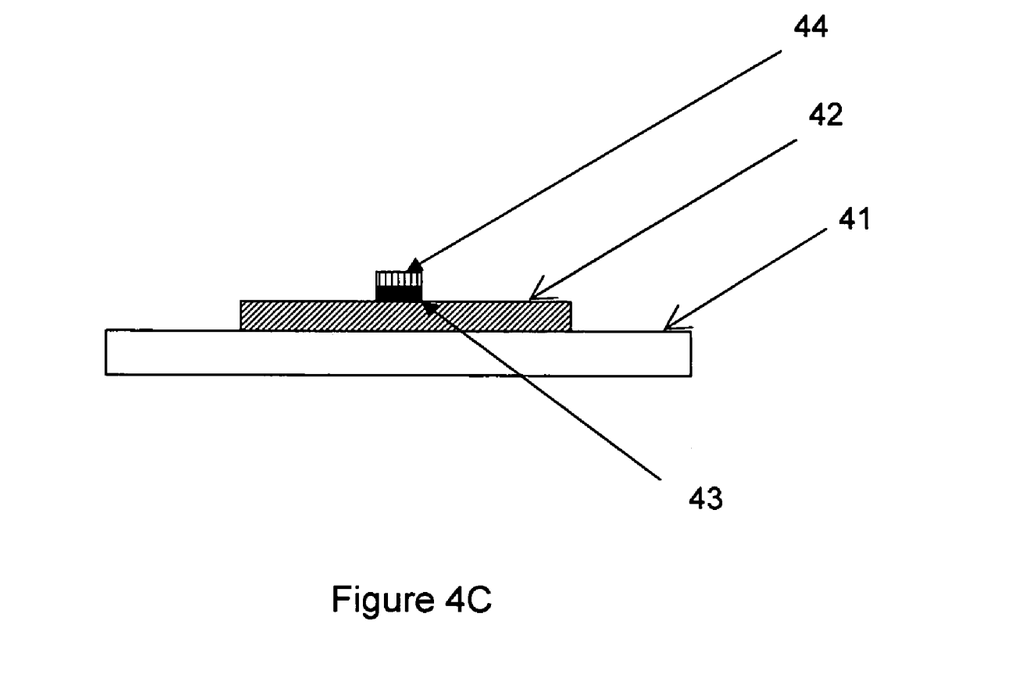

In the third step 83, shown in FIG. 4C, an unpackaged integrated circuit 44 with memory tag functionality is formed over the heatsink layer 42. The heatsink layer 42 and the unpackaged integrated circuit are attached in any appropriate manner. An appropriate choice is an epoxy 43, particularly an electrically conducting epoxy. Use of an electrically conducting epoxy has potential for an additional benefit—not only will electrical conductors also be the best thermal conductors, but if the epoxy 43 is connected to the ground plane of the unpackaged integrated circuit, then heatsink layer 42, if an electrical conductor (as will again generally be the case for a good thermal conductor) will form an extension to the ground plane. This reduces the risk of irregular performance of the memory tag. Another option, however, is to use a thermally conductive but electrically insulating epoxy 43, thereby electrically insulating the heatsink layer 42 from the ground plane, and any other part, of the integrated circuit. This will provide the whole device with different electromagnetic properties from those that would be present if the integrated circuit ground plane and heatsink layer were electrically connected—these different properties may be used to expand the range of design choices available.

Figure 4D:
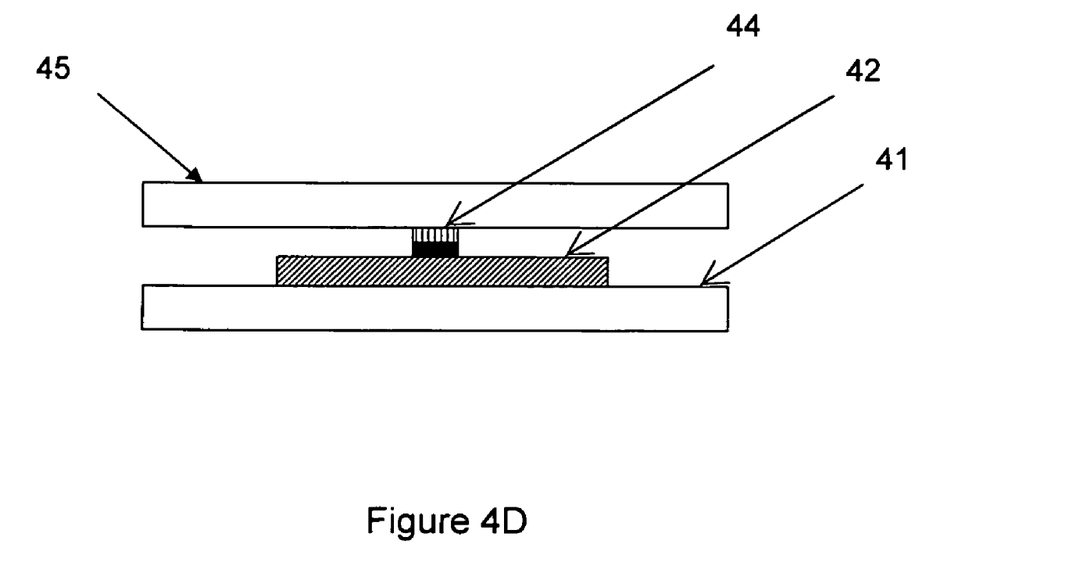

In the fourth step 84, shown in FIG. 4D, a second layer 45 of web material is provided over the top of the first layer 41 in such a way that the heatsink layer 42 and the unpackaged integrated circuit 44 lie between the two web material layers. The first and second layers may be formed of the same, or of different, web materials or web material types (for example, each layer may be of a different plastics material, or one layer may be of a plastics material and the other of a paper). If a large number of devices are formed on the first layer material, the second layer material may similarly be provided as an extended length of material—both first and second layers may be provided from rolls of web material (in a manner familiar for processing of both plastics materials and papers) continuously or intermittently advanced past processing points, each for the performance of one of the processing steps indicated here.

Figure 4E:
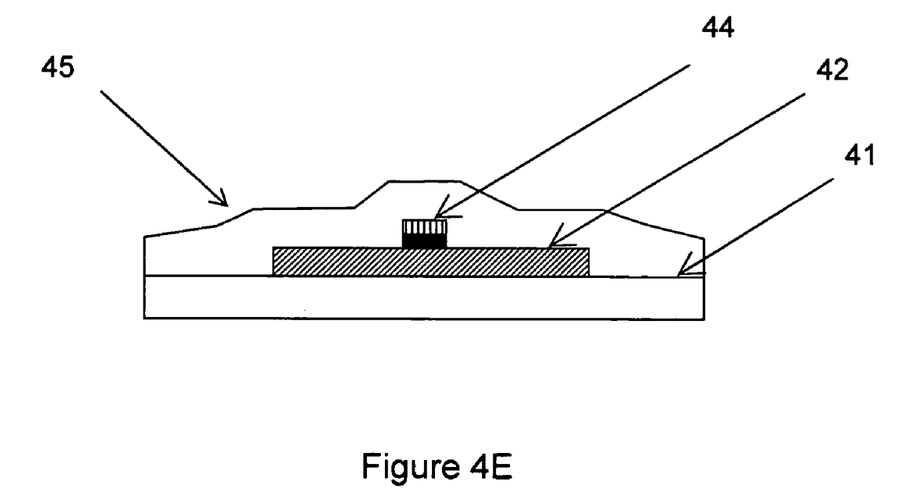

In the fifth step 85, shown in FIG. 4E, the first layer 41 and the second layer 45 are bonded together so as to encapsulate the heatsink layer 42 and the unpackaged integrated circuit 44. This may be achieved by any appropriate method to bond together the materials of the first layer 41 and the second layer 45—a thermal bonding method may be used for certain plastics materials (particularly when the same plastics material is used for each layer), and for others an adhesive may be used (in which case it may be necessary to deposit a pattern of adhesive material on the first layer 41 around the heatsink layer 42 before providing the second layer 45). If a plurality of devices is being formed on an extended length of first layer material, these may at this point be separated by an additional cutting step.

Figure 5:
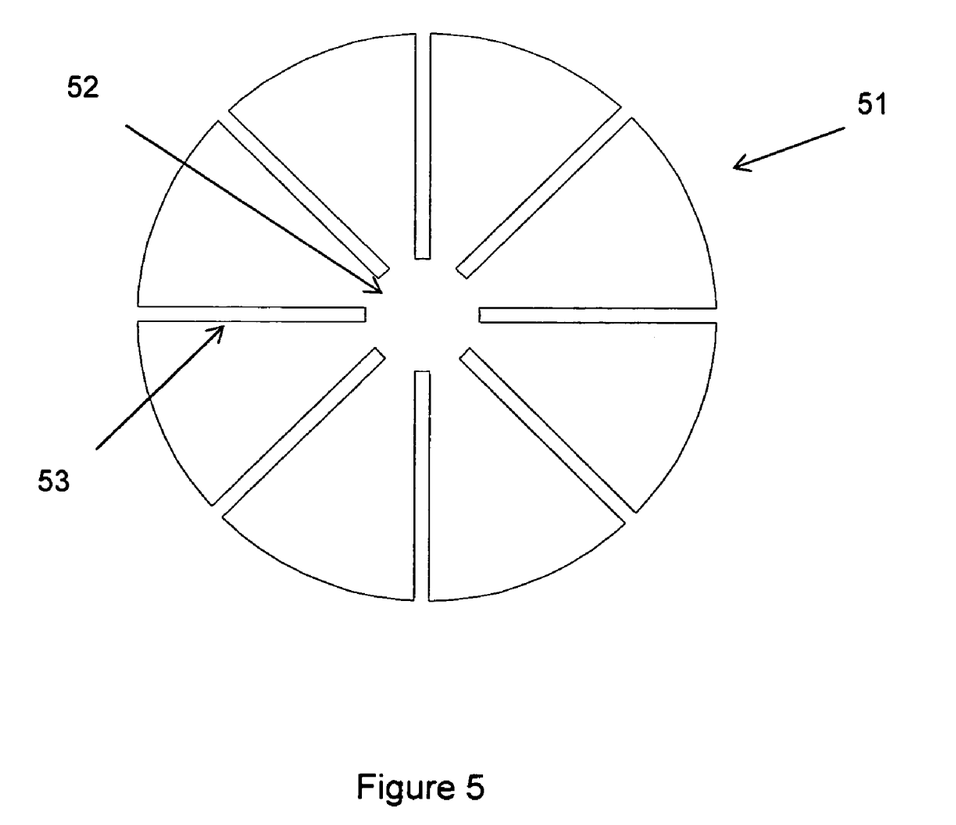
FIG. 5 shows a heatsink suitable for use in an inductively powered transponder device according to embodiments of the invention.

An appropriate heatsink design is shown in FIG. 5. The heatsink 51 is in the form of a disk. The disk has at least one slot 53—in the case shown, a total of eight radial slots arranged symmetrically and each extending up to a solid central region 52 of the heatsink. The unpackaged integrated circuit is to be mounted on this solid central region 52, ensuring that it makes good thermal (and if required, electrical) contact with the heatsink 51 and minimising the risk of producing a defective device. A heatsink to this design may be freestanding (for example, a copper disk from which slots have been removed) or may be formed as a metallization directly on to a layer of plastics material or paper using any appropriate metallization technique. The purpose of the slot or slots 53 is to prevent significant eddy currents forming around the heatsink when a functioning transponder device is being inductively powered by radio frequency transmission, as such eddy currents and resultant fields could significantly reduce the effective transfer of power and signal to the device. Slots 53 are one mechanism to prevent such eddy currents by influencing the available current path. The skilled person tasked with reducing eddy currents in a heatsink suitable for use in embodiments of the invention will appreciate how to optimise design performance once given this task, and would consider design options other than use of slots 53. For example, another approach which may provide satisfactory performance is not to use slots, but to design the heatsink to have a shape and electromagnetic properties which cause it to tune effectively with the reader antenna. The heatsink is not limited to a disk design—any other geometrical shape may be effective (though a disk is an efficient way to provide heatsink extending for at least a given distance around a centrally mounted chip, which may have benefit, as is discussed below).

Figure 6:
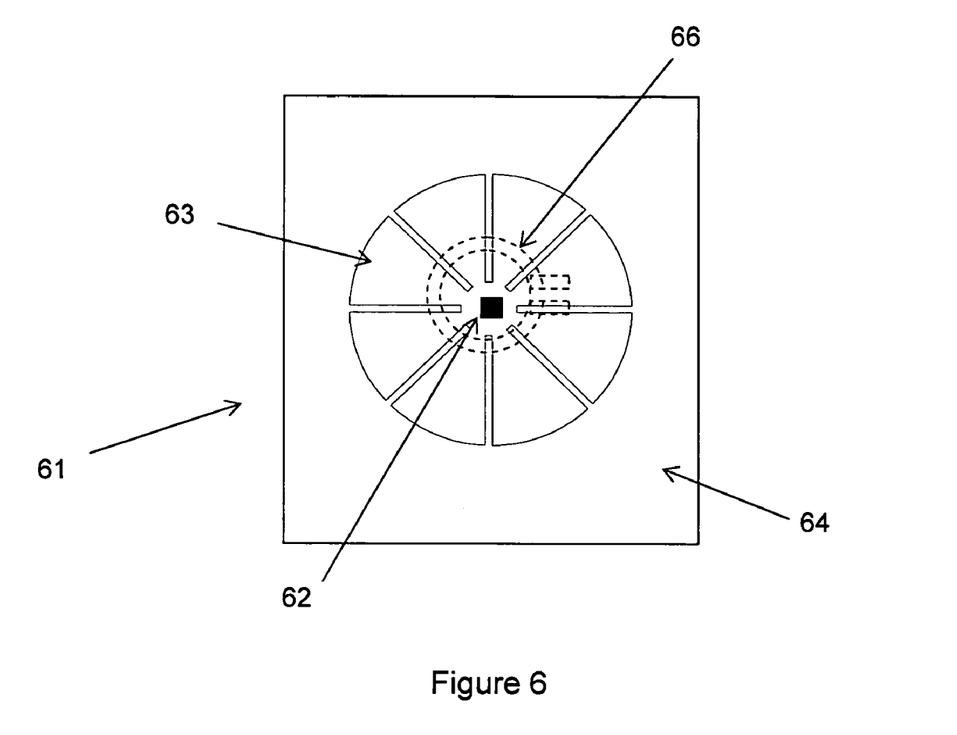
FIG. 6 shows a coil of a read/write device powering an inductively powered transponder device according to an embodiment of the invention.

FIG. 6 illustrates the powering of a transponder device according to an embodiment of the invention. The transponder device 61 consists of an unpackaged integrated circuit 62 mounted on a heatsink 63 and encapsulated within paper or plastics material 64. The induction coil 66 of a reader device is shown—dashed—overlying the integrated circuit so that power can be effectively transferred between the reader induction coil 66 and the antenna of the unpackaged integrated circuit 62. Use of the heatsink 63 may here have an additional benefit. In many use contexts, there may be a number of transponder devices close to a reader device, but it is desirable for the reader only to power and hence interact with the transponder device to which it is nearest (or, rather, the transponder device that the user of the reader device is trying to interact with). This may be particularly difficult to achieve when transponder devices are overlying each other (as if, for example, a transponder device is placed on each of successive pages of a book or other document), as the reader may be able to power and interact with a transponder device not visible to the user. A conducting heatsink may serve to block signal—and hence power—to a transponder device that lies underneath it, thus reducing the likelihood that a reader device will be powering and hence interacting with more than one transponder device. The heatsink device may even be designed, in accordance with reader power and power requirements for transponder devices, substantially to prevent powering of a transponder device of the same (or other specified) type underlying the heatsink device. Use of a disk shaped heatsink device may assist in this purpose (as if the induction coil 66 lies directly over the integrated circuit, then there is a minimum distance needed in any direction to go around the heatsink). The skilled person will appreciate that design to prevent eddy currents, particularly by use of slots, acts against design to use the heatsink device as a mask in this fashion—the skilled person will further appreciate how practical steps can be taken best to optimise this design.

Figure 7:
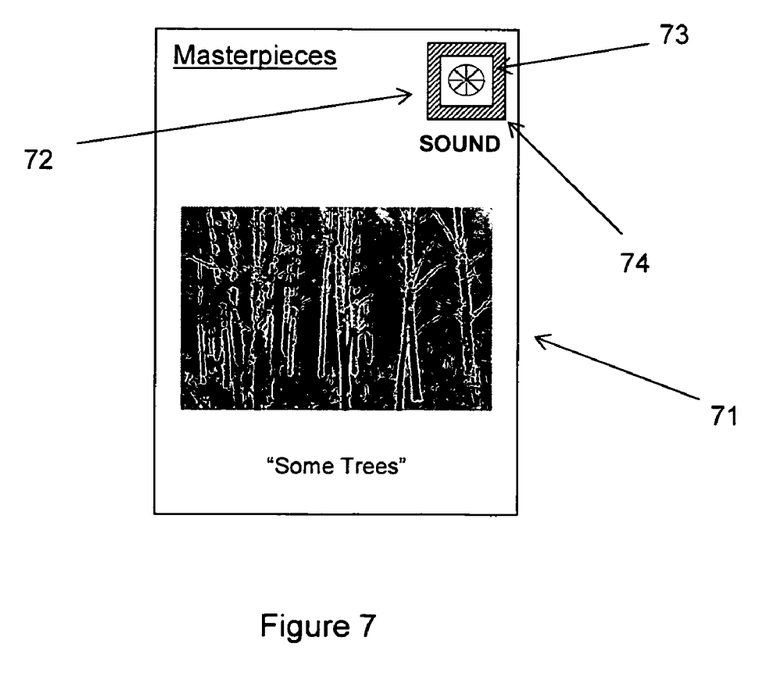
FIG. 7 shows a memory tag label according to an embodiment of the invention.

FIG. 7 shows use of a transponder device according to embodiments of the invention. A document page 71 is provided with a transponder device 72 having an encapsulated integrated circuit on heatsink structure 73 as described above. An outer region 74 of the transponder device is adhered to the page 71—the two may be bonded together on or after the printing of the page, or the transponder device 72 may be provided as an adhesive label with region 74 being added, or made adhesive, after the manufacturing steps described above with reference to FIGS. 4A to 4E. Such as device has a very low profile and allows the document page 71 to be incorporated in a book which may be used in an otherwise conventional manner, because the low device profile enables the page 71 to function in all respects (other than its additional transponder functionality) as a normal book page because its thickness and other physical properties are very little affected. If the page 71 is formed of thick paper or card, the device may be inset and so have no effect on page thickness at all.

The invention claimed is:

1. An inductively powered transponder device comprises:
   an unpackaged integrated circuit in which is integrated an antenna for receiving power and signal from radio frequency transmissions;
   a heatsink thermally connected to the integrated circuit and having means to prevent eddy currents, wherein the heatsink comprises a metallic layer and the means to prevent eddy currents comprises one or more slots in the metallic layer; and
   a first layer and a second layer of web material attached together to encapsulate the integrated circuit and the heatsink;
   wherein one or both of the first layer and the second layer are formed substantially of paper.

2. An inductively powered transponder device as claimed in claim 1 wherein the metallic layer extends over the whole surface of the unpackaged integrated circuit to which it is adjacent.

3. An inductively powered transponder device as claimed in claim 1 wherein the heatsink comprises a metallization formed on one of the first layer and the second layer.

4. An inductively powered transponder device as claimed in claim 1 wherein the heatsink comprises a freestanding metallic element.

5. An inductively powered transponder device as claimed in claim 1, wherein the heatsink is formed substantially of copper.

6. An inductively powered transponder device as claimed in claim 1 wherein the heatsink is electrically connected to a ground plane of the unpackaged integrated circuit.

7. An inductively powered transponder device as claimed in claim 1 wherein the heatsink is electrically insulated from the unpackaged integrated circuit.

8. An inductively powered transponder device as claimed in claim 1 wherein the unpackaged integrated circuit comprises functionality of a memory tag.

9. A method of manufacturing an inductively powered transponder device, comprising:
   providing a first layer of web material;
   forming a heatsink layer, having means to prevent eddy currents, on the first layer, wherein the heatsink layer comprises a metallic layer and the means to prevent eddy currents comprises one or more slots formed in the metallic layer;
   attaching an unpackaged integrated circuit with an antenna for receiving power and signal from radio frequency transmissions on the heatsink layer;
   providing a second layer of web material over the first layer such that the heatsink layer and the unpackaged integrated circuit lie therebetween; and
   encapsulating the heatsink layer and the unpackaged integrated circuit between the first layer and the second layer;
   wherein one or both of the first layer and the second layer are formed substantially of paper.

10. A method as claimed in claim 9 wherein forming a heatsink layer comprises forming a metallization on a part of one surface of the first layer.

11. A method as claimed in claim 9 wherein forming a heatsink layer comprises bonding a freestanding metallic element to the first layer.

12. A method as claimed in claim 9, wherein the metallic layer of the heatsink extends over the whole surface of the unpackaged integrated circuit to which it is adjacent.

13. A method as claimed in claim 9, wherein the heatsink layer is bonded with an epoxy to the unpackaged integrated circuit.

14. A method as claimed in claim 9, wherein a plurality of inductively powered transponder devices are formed together on an extended length of the first material and wherein the inductively powered transponder devices are separated from each other at or after the encapsulation step.

15. A memory tag comprising an unpackaged integrated circuit with an antenna and adapted to receive power and signal from radio frequency transmissions, the unpackaged integrated circuit being in thermal contact with a heatsink having means to prevent eddy currents, wherein the unpackaged integrated circuit and the heatsink are encapsulated between two layers of a web material, wherein the two layers are formed substantially of paper, and wherein the heatsink comprises a metallic layer and the means to prevent eddy currents comprises one or more slots formed in the metallic layer.

16. A memory tag as claimed in claim 15, having attachment means to allow the memory tag to be affixed to a surface as a label.

* * * * *